(12) United States Patent
Tang et al.

(10) Patent No.: US 11,063,209 B2
(45) Date of Patent: Jul. 13, 2021

(54) METHOD AND SYSTEM FOR PROVIDING MAGNETIC JUNCTIONS UTILIZING OXYGEN BLOCKING, OXYGEN ADSORBER AND TUNING LAYER(S)

(71) Applicant: Samsung Electronics Co., LTD., Gyeonggi-do (KR)

(72) Inventors: Xueti Tang, Fremont, CA (US); Gen Feng, North Potomac, MD (US); Mohamad Towfik Krounbi, San Jose, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/659,605

(22) Filed: Jul. 25, 2017

(65) Prior Publication Data

US 2018/0351086 A1 Dec. 6, 2018

Related U.S. Application Data

(60) Provisional application No. 62/512,653, filed on May 30, 2017.

(51) Int. Cl.
*H01L 43/08* (2006.01)
*H01L 43/02* (2006.01)
*H01L 27/22* (2006.01)
*H01L 43/12* (2006.01)

(52) U.S. Cl.
CPC ............ *H01L 43/08* (2013.01); *H01L 27/222* (2013.01); *H01L 43/02* (2013.01); *H01L 43/12* (2013.01)

(58) Field of Classification Search
CPC ........ H01L 27/222; H01L 43/08; H01L 43/02
See application file for complete search history.

(56) References Cited

U.S. PATENT DOCUMENTS

| 5,923,504 | A  | 7/1999  | Araki |
| 7,449,345 | B2 | 11/2008 | Horng |
| 7,528,457 | B2 | 5/2009  | Horng |
| 8,362,454 | B2 | 1/2013  | Lee |
| 8,878,318 | B2 | 11/2014 | Chen |

(Continued)

OTHER PUBLICATIONS

Corrosionpedia, Noble Metal, archived Apr. 23, 2015 (Year: 2015).*

(Continued)

*Primary Examiner* — Shih Tsun A Chou
(74) *Attorney, Agent, or Firm* — Van Pelt, Yi & James LLP

(57) ABSTRACT

A magnetic junction and method for providing the magnetic junction are described. The magnetic junction resides on a substrate and is usable in a magnetic device. The magnetic junction includes a pinned layer, a nonmagnetic spacer layer, a free layer, an oxide layer and at least one oxygen blocking layer. The free layer is switchable between a plurality of stable magnetic states when a write current is passed through the magnetic junction. The nonmagnetic spacer layer is between the pinned layer and the free layer. The oxide layer is adjacent to the free layer. The free layer is between the nonmagnetic spacer layer and the oxide layer. The oxygen blocking layer(s) has a position selected from adjacent to the oxide layer and adjacent to the pinned layer. In some aspects, the magnetic junction may also include an oxygen adsorber layer and/or a tuning layer.

15 Claims, 6 Drawing Sheets

(56) References Cited

U.S. PATENT DOCUMENTS

| | | | |
|---|---|---|---|
| 8,987,006 B2 | 3/2015 | Moon | |
| 9,006,704 B2 | 4/2015 | Jan | |
| 9,123,887 B2 | 9/2015 | Lai | |
| 9,147,833 B2 | 9/2015 | Pi | |
| 9,318,695 B2 * | 4/2016 | Oh | H01L 43/02 |
| 9,461,242 B2 | 10/2016 | Sandhu | |
| 2009/0102598 A1 * | 4/2009 | Yamazaki | H01L 45/04 338/20 |
| 2012/0023386 A1 * | 1/2012 | Oh | H01L 43/08 714/769 |
| 2012/0155156 A1 * | 6/2012 | Watts | B82Y 25/00 365/158 |
| 2012/0218813 A1 * | 8/2012 | Oh | G11C 11/161 365/158 |
| 2012/0241878 A1 * | 9/2012 | Hu | H01L 43/08 257/421 |
| 2014/0175582 A1 * | 6/2014 | Apalkov | H01L 43/08 257/425 |
| 2014/0361391 A1 * | 12/2014 | Shen | H01L 43/10 257/421 |
| 2016/0172585 A1 | 6/2016 | Guo | |
| 2016/0284763 A1 | 9/2016 | Tahmasebi | |
| 2017/0338402 A1 * | 11/2017 | Hu | H01L 43/12 |
| 2019/0334079 A1 * | 10/2019 | Rahman | H01L 43/08 |

OTHER PUBLICATIONS

Oliver Passe, Passive Flux—the Roll of Nano-ceramic Technology to Enhance the Flow and Bond Characteristics of Metals, Proceedings from the 5th International brazing and Soldering Conference, Apr. 2012, pp. 355-363 (Year: 2012).*

* cited by examiner

METHOD AND SYSTEM FOR PROVIDING MAGNETIC JUNCTIONS UTILIZING OXYGEN BLOCKING, OXYGEN ADSORBER AND TUNING LAYER(S)

CROSS-REFERENCE TO RELATED APPLICATIONS

This application claims the benefit of provisional Patent Application Ser. No. 62/512,653, filed May 30, 2017, entitled CAPPING LAYER ON THE TOP OF SUB-OXIDE IN PERPENDICULAR MAGNETIC JUNCTIONS, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The MTJ, uses seed layer(s), may include capping layers and may include an antiferromagnetic (AFM) layer. The conventional MTJ includes a pinned layer, a free layer and a tunneling barrier layer between the pinned and free layers. A bottom contact below the MTJ and a top contact on the MTJ may be used to drive current through the MTJ in a current-perpendicular-to-plane (CPP) direction.

The pinned layer and the free layer are magnetic. The magnetization of the pinned layer is fixed, or pinned, in a particular direction. The free layer has a changeable magnetization. The free layer may be a single layer or include multiple layers.

To switch the magnetization of the free layer, a current is driven perpendicular to plane. When a sufficient current is driven from the top contact to the bottom contact, the magnetization of the free layer may switch to be parallel to the magnetization of a bottom pinned layer. When a sufficient current is driven from the bottom contact to the top contact, the magnetization of the free layer may switch to be antiparallel to that of the bottom pinned layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. Mechanisms for improving the performance of STT-MRAM are desired. For example, a low switching current, sufficient thermal stability and high magnetoresistance may be desired for improved switching and signal. Accordingly, what is needed is a method and system that may improve the performance of spin transfer torque based memories. The method and system described herein address such a need.

BRIEF SUMMARY OF THE INVENTION

A magnetic junction and method for providing the magnetic junction are described. The magnetic junction resides on a substrate and is usable in a magnetic device. The magnetic junction includes a pinned layer, a nonmagnetic spacer layer, a free layer, an oxide layer and at least one oxygen blocking layer. The free layer is switchable between a plurality of stable magnetic states when a write current is passed through the magnetic junction. The nonmagnetic spacer layer is between the pinned layer and the free layer. The oxide layer is adjacent to the free layer. The free layer is between the nonmagnetic spacer layer and the oxide layer. The oxygen blocking layer(s) has a position selected from adjacent to the oxide layer and adjacent to the pinned layer. In some aspects, the magnetic junction may also include an oxygen adsorber layer and/or a tuning layer.

The magnetic junction may have improved perpendicular magnetic anisotropy for the free and/or for pinned layers. The magnetic junction may also have a reduced switching current. As a result, performance may be improved.

DETAILED DESCRIPTION OF THE INVENTION

Figure 1A:
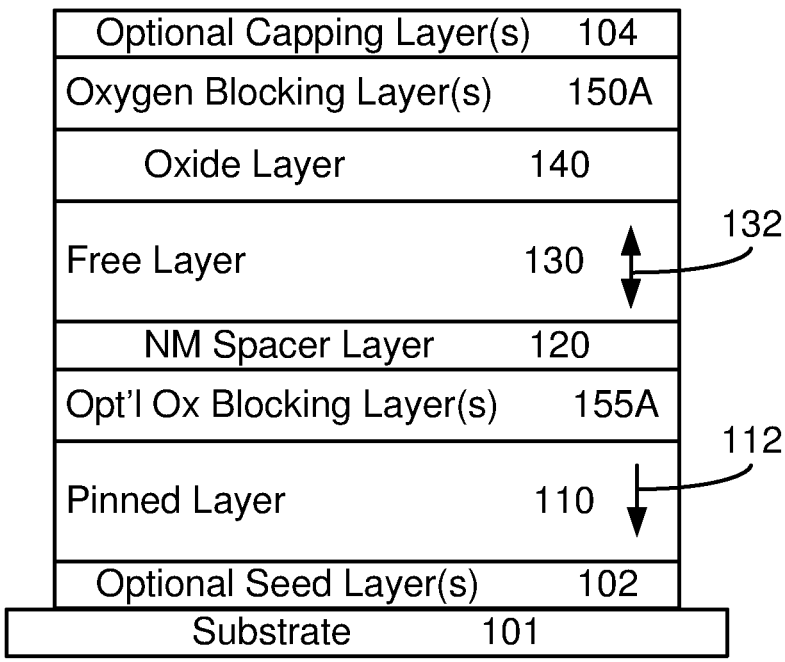
FIGS. 1A-1B depict exemplary embodiments of a magnetic junction usable in a magnetic memory, programmable using spin transfer torque and including at least one oxygen blocking layer.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and nonportable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction and method for providing the magnetic junction are described. The magnetic junction resides on a substrate and is usable in a magnetic device. The magnetic junction includes a pinned layer, a nonmagnetic spacer layer, a free layer, an oxide layer and at least one oxygen blocking layer. The free layer is switchable between a plurality of stable magnetic states when a write current is passed through the magnetic junction. The nonmagnetic spacer layer is between the pinned layer and the free layer. The oxide layer is adjacent to the free layer. The free layer is between the nonmagnetic spacer layer and the oxide layer. The oxygen blocking layer(s) has a position selected from adjacent to the oxide layer and adjacent to the pinned layer. In some aspects, the magnetic junction may also include an oxygen adsorber layer and/or a tuning layer.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the method and system may be used.

Figure 1B:
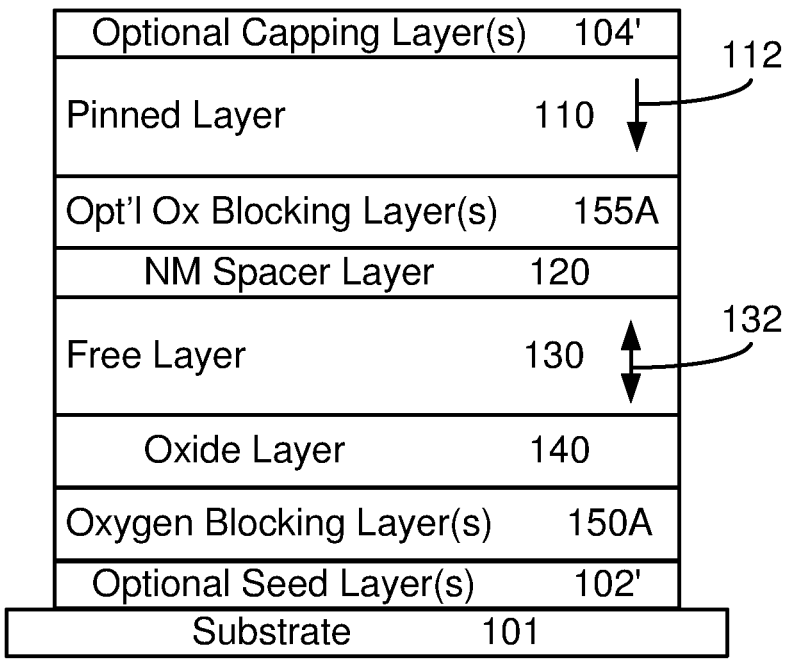

FIGS. 1A and 1B depict exemplary embodiments of a magnetic junction 100A and a magnetic junction 100A' usable in a magnetic memory, programmable using spin transfer torque and including at least one oxygen blocking layer. For clarity, FIGS. 1A and 1B are not to scale and not all components may be shown. The magnetic junctions 100A and 100A' may be used in a magnetic device such as a spin transfer torque magnetic random access memory (STT-MRAM) and, therefore, in a variety of electronic devices. Referring to FIG. 1A the magnetic junction 100A may include a pinned layer 110 having a magnetic moment 112, a nonmagnetic spacer layer 120, a free layer 130 having magnetic moment 132, oxide layer 140, oxygen blocking layer(s) 150A and optional additional oxygen blocking layer(s) 155A. Also shown are optional seed layer(s) 102 and capping layer(s) 104. The substrate 101 on which the magnetic junction 100 is formed resides below the seed layers and is shown for clarity. A bottom contact and a top contact are not shown but may be formed. Similarly, other layers may be present but are not shown for simplicity.

As can be seen in FIG. 1A, the magnetic junction 100A is a bottom magnetic junction. In another embodiment, the layers 110, 155, 120, 130, 140 and 150A may be reversed. In such an embodiment, the magnetic junction would be a top pinned magnetic junction. FIG. 1B depicts such a magnetic junction 100A'. The components of the magnetic junction 100A' are analogous to those in FIG. 1A and thus are not discussed separately. However, because the magnetic junction 100A' is a top pinned magnetic junction, the optional seed layer(s) 102' and capping layer(s) 104' may differ from the seed layer(s) 102 and capping layer(s) 104. Referring back to FIG. 1A, optional pinning layer(s) (not shown) may be used to fix the magnetization of the pinned layer 110. In some embodiments, the optional pinning layer may be an AFM layer or multilayer that pins the magnetization(s) through an exchange-bias interaction. However, in other embodiments, the optional pinning layer may be omitted or another structure may be used. In the embodiment shown, the magnetic moment 110 of the pinned layer 110 is pinned by the magnetic anisotropy of the pinned layer 110.

Other layers such as polarization enhancement layers (PELs), coupling layers and antiferromagnetic (AFM) or other layers and/or other layers may be present. However, such layers are not shown for simplicity. Further, one or more of the layers 110, 120, 130, 140, 150A and 155 may be a multilayer.

The free layer 130 and the pinned layer 110 each have a high perpendicular magnetic anisotropy (PMA). Stated differently, the perpendicular magnetic anisotropy energy exceeds the out-of-plane demagnetization energy for the layers 110 and 130. Such a configuration allows for the magnetic moments 112 and 132 of the layers 110 and 130, respectively, to be stable perpendicular to plane. Stated differently, the magnetic moments of the free layer 130 and pinned layer 110 are stable out-of-plane. In other embodiments, the layer(s) 110 and/or 130 may not have a high PMA. In such embodiments, the magnetic moment(s) 112 and/or 132 may be stable in-plane.

The magnetic junction 100A is also configured to allow the free layer magnetic moment 132 to be switched between stable magnetic states when a write current is passed through the magnetic junction 100A. Thus, the free layer 130 is switchable utilizing spin transfer torque when a write current is driven through the magnetic junction 100A in a current perpendicular-to-plane (CPP) direction. The direction of the magnetic moment 132 of the free layer 108 may be read by driving a read current through the magnetic junction 100A.

The nonmagnetic spacer layer 120 may be a tunneling barrier layer. For example, the nonmagnetic spacer 120 may be a crystalline MgO tunneling barrier with a (100) orientation. Such a nonmagnetic spacer layer 120 may enhance TMR of the magnetic junction 100A. The nonmagnetic spacer layer 120 may also be considered to serve as a seed layer for the free layer 130. In an alternate embodiment, the nonmagnetic spacer layer 120 may have another structure including but not limited to being a conductive layer.

The pinned layer 110 has a PMA energy greater than a pinned layer out-of-plane demagnetization energy. Thus, the moment 112 is stable perpendicular-to-plane. In alternate embodiments, the magnetic moment 112 may be stable in-plane. The pinned layer 110 is shown as being simple, single layers. However, in other embodiments, the pinned layer 110 may be a multilayer. For example, the pinned layer(s) 110 might be a synthetic antiferromagnet (SAF) including two magnetically coupled ferromagnetic layers separated by and sandwiching a nonmagnetic layer, such as Ru. Alternatively, the pinned layer 110 may include one or more high perpendicular anisotropy ($H_k$) multilayer(s). For example, the pinned layer 110 may be a Co/Pt multilayer. Other pinned layer(s) having other structures may be used.

The free layer 130 may have a high PMA. Thus, the free layer 130 has a PMA energy greater than a pinned layer out-of-plane demagnetization energy. Thus, the moment 132 is stable perpendicular-to-plane. In alternate embodiments, the magnetic moment 132 may be stable in-plane. The free layer is shown as being a simple, single layer. However, in other embodiments, the free layer 130 may be a multilayer. For example, the free layer 130 might be a SAF or other multilayer. In some embodiments, the free layer may include or consist of a CoFeB layer, a CoFeB/Fe bilayer, a CoFeB/FeMg bilayer, a CoFeB/CoFeBe bilayer, a CoFeB/CoFeBNb bilayer, a CoFeB/CoFeBMo bilayer, a CoFeBMo layer and a CoFeBNb layer. Other or additional alloys and/or multilayers may be used in other embodiments. As discussed above, the alloys CoFeBX refer to mixtures including Co, Fe, B and X but in which the ratios between the constituents is not specified. CoFeBX may be the same as to $[Co_x Fe_y B_z]_u X_t$, where the subscripts refer to atomic percentages, $u+t=1$ and $x+y+z=1$. In addition, u, t, x, y and t are each nonzero. In some embodiments, CoFeB includes at least ten atomic percent and not more than sixty atomic percent B (i.e. z is at least 0.1 and not more than 0.6). In some such embodiments, the CoFeB includes not more than forty atomic percent B. Further, other and/or different layers and/or materials may be used in the free layer 130. The concentration of the dilutant X may be as low as zero atomic percent and not more than thirty atomic percent ($0 \le t \le 0.3$). For example, the free layer may include $(Co_{0.45}Fe_{0.45}B_{0.1})_{0.7}Nb_{0.3}$.

The layers surrounding the free layer 130 may be tailored to aid the free layer 130 in maintaining a high PMA and/or improve the characteristics of the free layer. For example, the nonmagnetic spacer layer 120 may be crystalline magnesium oxide, as discussed above. Such a layer may enhance the PMA of the free layer 130.

The oxide layer 140 shares an interface with, or adjoins, the free layer 130. In other embodiments, another layer (not shown) may be between the free layer 130 and the oxide layer 140. The oxide layer 140 and may improve the performance of the free layer 130. For example, the oxide layer 140 may increase the PMA of the free layer 140 and/or reduce the magnitude of the switching current for the free layer 140. In some embodiments, such an oxide layer 140 includes at least one of magnesium oxide, tantalum oxide, tungsten oxide, titanium oxide, vanadium oxide and an oxide of a Ir/Mg bilayer. The oxide layer 140 may be formed by depositing metallic layer(s) and performing an oxide treatment. In some such embodiment, a plasma treatment may be performed after deposition of the metallic layer(s) and before the oxide treatment. The oxide layer 140 may be at least three Angstroms thick and not more than ten Angstroms thick. In other embodiments, other thicknesses are possible.

Because the oxide layer 140 is between the oxygen blocking layer 150A and the free layer 130, the oxygen blocking layer(s) 150A are not more than twenty Angstroms from the free layer 130. In some embodiments, the oxygen blocking layer(s) 150A are not more than ten Angstroms from the free layer 130. In the embodiment shown, the oxygen blocking layer(s) 150A adjoin the capping layer(s) 104. In other embodiments, there may be additional layers (not shown) between the oxygen blocking layer(s) 150A and the capping layer(s) 104 or top of the magnetic junction 100A. In some embodiments, however, no ferromagnetic layers are between the oxygen blocking layer(s) 150A and the top of the magnetic junction 100A.

Despite being some distance from the free layer 130, the oxygen blocking layer(s) 150A may improve performance of the free layer 130. The oxygen blocking layer 150A is a barrier to movement of oxygen through the layer 150A. Although termed an oxygen "blocking" layer, the layer 150A may not completely prevent movement of oxygen through the layer 150A. The material(s) used and thickness of the oxygen blocking layer(s) 150A are such that oxygen is unlikely to pass through the oxygen blocking layer(s) 150A. For example, the oxygen blocking layer 150A may be at least three Angstroms thick. In some embodiments, the oxygen blocking layer 150A is at least five Angstroms thick and not more than twenty Angstroms thick. The oxygen blocking layer 150A may also include at least one of Ir and Ru. An Ir layer, a Ru layer and/or a bilayer of Ir and Ru at the above thicknesses may be an acceptable barrier to movement of oxygen. Use of the oxygen blocking layer 150A may result in an enhanced PMA for the free layer 130. In addition, the thermal stability coefficient (A) for the free layer 130 may be increased.

The optional oxygen blocking layer 155A that is adjacent to the pinned layer 110 is analogous to the oxygen blocking layer 150A. Thus, the material(s) used and thickness of the oxygen blocking layer(s) 155A are such that oxygen is unlikely to pass through the oxygen blocking layer(s) 155A. For example, the oxygen blocking layer 155A may be at least three Angstroms thick. In some embodiments, the oxygen blocking layer 155A is at least five Angstroms thick and not more than twenty Angstroms thick. The oxygen blocking layer 155A also includes at least one of Ir and Ru. The oxygen blocking layer 155A may improve the PMA and thermal stability of the pinned layer 110. Although shown as adjoining/sharing an interface with the pinned layer 110, in other embodiments, the oxygen blocking layer 155A may be separated from the pinned layer 110 by one or more other layers. In some embodiments, the magnetic junction 100A includes both oxygen blocking layers 150A and 155A. In other embodiments, the magnetic junction 100A may include only the oxygen blocking layer(s) 150A. In still other embodiments, the magnetic junction 100A may include only the oxygen blocking layer(s) 155A.

The magnetic junction 100A having the oxide layer 140 and one or more of the oxygen blocking layer(s) 150A and 155A may have improved performance. The oxide layer 140 may improve the switching characteristics of the free layer 130. This reduction in switching current may also improve other aspects of performance, such as switching speed. The oxygen blocking layers 150A and 155A may enhance the PMA for the free layer 130 and pinned layer 110, respectively. The magnetic junction 100A' may share the benefits of the magnetic junction 100A. Thus, performance of the magnetic junction 100A and/or 100A' and magnetic device employing such magnetic junctions 100A/100A' may be enhanced.

Figure 2:
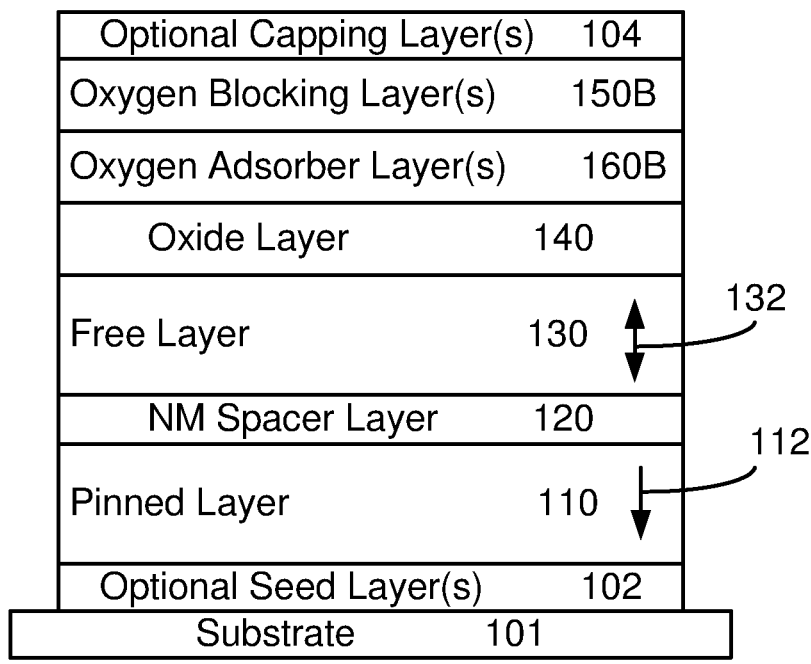
FIG. 2 depicts another exemplary embodiment of a magnetic junction usable in a magnetic memory, programmable using spin transfer torque and including at least one oxygen blocking layer.

FIG. 2 depicts another exemplary embodiment of a magnetic junction 100B in magnetic devices such as a magnetic memory programmable using spin transfer torque. For clarity, FIG. 2 is not to scale and not all components may be shown. The magnetic junction 100B is analogous to the magnetic junction 100A. Consequently, similar components have analogous labels. The magnetic junction 100B is a bottom pinned magnetic junction that includes pinned layer 110 having magnetic moment 112, nonmagnetic spacer layer 120, free layer 130 having magnetic moment 132, oxide layer 140 and oxygen blocking layer(s) 150B that are analogous to the pinned layer 110 having magnetic moment 112, nonmagnetic spacer layer 120, free layer 130, oxide layer 140 and oxygen blocking layers 150A, respectively. Optional seed layer 102 and capping layer 104 as well as the substrate 101 are also shown. Although omitted in the magnetic junction 100B, in other embodiments, the oxygen blocking layer 155A may be included. In another embodiment, the order of the layers might 110, 120, 130, 140, 150B and 160B may be reversed such that the magnetic junction 100B is a top pinned magnetic junction.

The structure, function and material(s) used for the pinned layer 110, nonmagnetic spacer layer 120, free layer 130 and oxide layer 140 in the magnetic junction 100B are analogous to those used in the magnetic junction 100A. For example, the oxide layer 140 may include at least one of magnesium oxide, tantalum oxide, tungsten oxide, titanium oxide, vanadium oxide and an oxide of a Ir/Mg bilayer. The oxide layer 140 may be at least three Angstroms thick and not more than ten Angstroms thick. The oxygen blocking layer 140B is analogous to the oxygen blocking layer 150A. Although shown in FIG. 2, in other embodiments, the oxygen blocking layer 150B might be omitted.

The oxygen blocking layer 150B also has analogous structure and function to the oxygen blocking layer 150A. For example, the oxygen blocking layer 150B may be at least three Angstroms thick. In some embodiments, the oxygen blocking layer 150B is at least five Angstroms thick and not more than twenty Angstroms thick. The oxygen blocking layer 150B may also include at least one of Ir and Ru. An Ir layer, a Ru layer and/or a bilayer of Ir and Ru at the above thicknesses may be an acceptable barrier to movement of oxygen. Use of the oxygen blocking layer 150B may result in an enhanced PMA for the free layer 130.

In addition, the magnetic junction 100B includes oxygen adsorber layer(s) 160B. In the embodiment shown, the oxygen adsorber layer(s) 160B share an interface with the oxide layer 140 and reside between the oxygen blocking layer(s) 150B and the oxide layer 140. The oxygen adsorber layer 160B shares another interface with the oxygen blocking layer 160B. Other locations are possible. In some embodiments, no magnetic layers reside between the oxygen adsorber layer 160B and the capping layers 104 and/or the top of the magnetic junction 100B.

The oxygen adsorber layer 160B may be used to improve the performance of the free layer 130. The oxygen adsorber layer 160B may have an affinity for oxygen that is greater than or equal to that of the adjacent layers. For example, the oxygen adsorber layer 160B may include Mg and/or Ti. In some embodiments, the oxygen adsorber layer 160B is at least three Angstroms thick and not more than ten Angstroms thick. It is believed that oxygen tends to diffuse toward the oxygen adsorber layer 160B.

The oxygen adsorber layer 160B may improve the switching characteristics of the free layer 130. The oxygen adsorber layer 160B may reduce the resistance area product (RA) of a portion of the magnetic junction. Because of its ability to attract oxygen, the oxygen adsorber layer 160B may also be used to tune (e.g. reduce) the oxygen content of the free layer 130. Further, it has been shown that the switching current may decrease in the presence of the oxygen adsorber layer 160B. This reduction in switching current may also improve other aspects of performance, such as switching speed. Thus, performance of the magnetic junction and magnetic device employing such a free layer may be enhanced.

The magnetic junction 100B may share the benefits of the magnetic junction 100A. The free layer 130 and/or pinned layer 110 may have increased PMA. Further, the switching current may be reduced by the presence of the oxide layer 140 and the oxygen adsorber layer 160B. Switching characteristics of the free layer 130 may be enhanced. Thus, the magnetic junction 100B may have improved performance.

Figure 3:
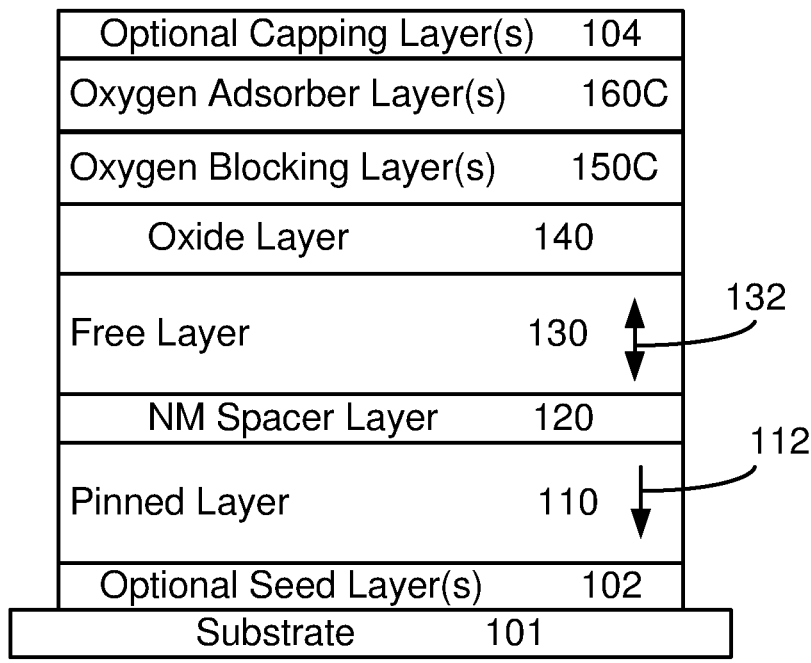
FIG. 3 depicts another exemplary embodiment of a magnetic junction usable in a magnetic memory, programmable using spin transfer torque and including at least one oxygen blocking layer.

FIG. 3 depicts another exemplary embodiment of a magnetic junction 100C in magnetic devices such as a magnetic memory programmable using spin transfer torque. For clarity, FIG. 3 is not to scale and not all components may be shown. The magnetic junction 100C is analogous to the magnetic junction(s) 100A and 100B. Consequently, similar components have analogous labels. The magnetic junction 100C is a bottom pinned magnetic junction that includes pinned layer 110 having magnetic moment 112, nonmagnetic spacer layer 120, free layer 130 having magnetic moment 132, oxide layer 140, oxygen blocking layer(s) 150C and oxygen adsorber layer(s) 160C that are analogous to the pinned layer 110 having magnetic moment 112, nonmagnetic spacer layer 120, free layer 130, oxide layer 140, oxygen blocking layers 150A and 150B and oxygen adsorber layer 160B, respectively. Optional seed layer 102 and capping layer 104 as well as the substrate 101 are also shown. Although omitted in the magnetic junction 100C, the oxygen blocking layer 155A may be included in another embodiment. In another embodiment, the order of the layers might 110, 120, 130, 140, 150C and 160C may be reversed such that the magnetic junction 100C is a top pinned magnetic junction.

The structure, function and material(s) used for the pinned layer 110, nonmagnetic spacer layer 120, free layer 130 and oxide layer 140 in the magnetic junction 100B are analogous to those used in the magnetic junction 100A. For example, the oxide layer 140 may include at least one of magnesium oxide, tantalum oxide, tungsten oxide, titanium oxide, vanadium oxide and an oxide of a Ir/Mg bilayer. The oxide layer 140 may be at least three Angstroms thick and not more than ten Angstroms thick. The oxygen blocking layer 150B is analogous to the oxygen blocking layer 150A. Although shown in FIG. 2, in other embodiments, the oxygen blocking layer 150B may be omitted.

The oxygen blocking layer(s) 150C and oxygen adsorber layer(s) 160C are analogous to the oxygen blocking layer(s) 150A and 150B and oxygen adsorber layer(s) 160B, respectively. For example, the oxygen blocking layer 150C may include at least one of Ir and Ru that may be in the thickness ranges described above. Similarly, the oxygen adsorber layer 160C may include Mg and/or Ti in the thickness ranges described above. Thus, the magnetic junction 100C is most analogous to the magnetic junction 160B. However, the locations of the oxygen adsorber layer 160C and oxygen blocking layer 150C have been interchanged.

The magnetic junction 100C may share the benefits of the magnetic junction(s) 100A and/or 100B. The oxygen adsorber layer 160C may improve the switching characteristics of the free layer 130. More specifically, the oxygen adsorber layer 160C may reduce the RA, reduce the switching current and tune the oxygen content of the free layer 130. The oxygen blocking layer 150C may improve the PMA of the free layer 130. The oxide layer 140 may also improve PMA and reduce the switching current for the free layer 130. Thus, performance of the magnetic junction 100C and magnetic device employing the magnetic junction 100C may be enhanced.

Figure 4:
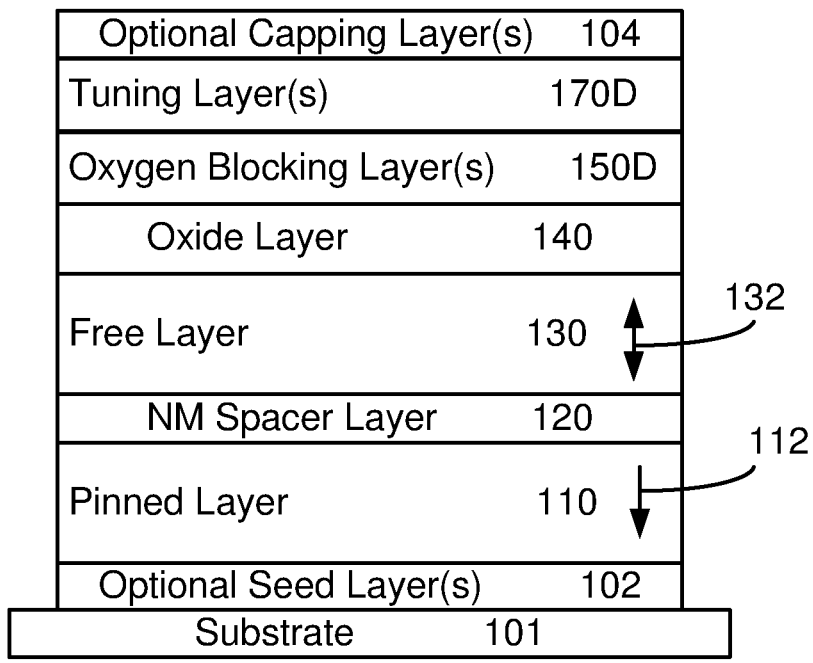
FIG. 4 depicts another exemplary embodiment of a magnetic junction usable in a magnetic memory, programmable using spin transfer torque and including at least one oxygen blocking layer.

FIG. 4 depicts another exemplary embodiment of a magnetic junction 100D in magnetic devices such as a magnetic memory programmable using spin transfer torque. For clarity, FIG. 4 is not to scale and not all components may be shown. The magnetic junction 100D is analogous to the magnetic junction(s) 100A, 100B and/or 100C. Consequently, similar components have analogous labels. The magnetic junction 100D is a bottom pinned magnetic junction that includes pinned layer 110 having magnetic moment 112, nonmagnetic spacer layer 120, free layer 130 having magnetic moment 132, oxide layer 140 and oxygen blocking layer(s) 150D that are analogous to the pinned layer 110 having magnetic moment 112, nonmagnetic spacer layer 120, free layer 130, oxide layer 140 and oxygen blocking layers 150A, 150B and 150C, respectively. Optional seed layer 102 and capping layer 104 as well as the substrate 101 are also shown. Although omitted in the magnetic junction 100D, the oxygen blocking layer 155A may be included in another embodiment. In another embodiment, the order of the layers might 110, 120, 130, 140, 150D and 170D may be reversed such that the magnetic junction 100C is a top pinned magnetic junction.

The structure, function and material(s) used for the pinned layer 110, nonmagnetic spacer layer 120, free layer 130 and oxide layer 140 in the magnetic junction 100D are analogous to those used in the magnetic junction 100A, 100B and/or 100C. For example, the oxide layer 140 may include at least one of magnesium oxide, tantalum oxide, tungsten oxide, titanium oxide, vanadium oxide and an oxide of a Ir/Mg bilayer. The oxide layer 140 may be at least three Angstroms thick and not more than ten Angstroms thick.

The oxygen blocking layer 150D also has analogous structure and function to the oxygen blocking layer 150A, 150B and/or 150C. For example, the oxygen blocking layer 150D may be at least three Angstroms thick. In some embodiments, the oxygen blocking layer 150D is at least five Angstroms thick and not more than twenty Angstroms thick. The oxygen blocking layer 150D also includes at least one of Ir and Ru. An Ir layer, a Ru layer and/or a bilayer of Ir and Ru at the above thicknesses may be an acceptable barrier to movement of oxygen. Use of the oxygen blocking layer 150D may result in an enhanced PMA for the free layer 130.

In addition, the magnetic junction 100D includes tuning layer(s) 170D. The tuning layer 170D shares an interface with the oxygen blocking layer 150D. Other locations are possible. In some embodiments, no magnetic layers reside between the tuning layer 170D and the capping layers 104 and/or the top of the magnetic junction 100D. The tuning layer 170D may include at least one of Mo, W, Ir, Ru and Ta. The tuning layer 170D may be at least five Angstroms thick. In some such embodiments, the tuning layer 170D may be at least ten Angstroms thick and not more than thirty Angstroms thick.

The tuning layer 170D may be used to improve the performance of the free layer 130. It has been determined that the switching current may be reduced and the PMA of the free layer 130 may be increased if the tuning layer 170D is present. It is believed that the presence of the tuning layer 170D may place an additional stress on the free layer 130 and/or may improve the crystallinity of the free layer 130. However, regardless of the physical mechanism involved in the improvement, the tuning layer 170D may be utilized in the magnetic junction 100D.

The magnetic junction 100D may share the benefits of the magnetic junction(s) 100A, 100B and/or 100C. The free layer 130 and/or pinned layer 110 may have increased PMA. Further, the switching current and for the free layer 130 may be reduced. In some cases, the switching time may also be diminished. Thus, the magnetic junction 100D may have improved performance.

Figure 5:
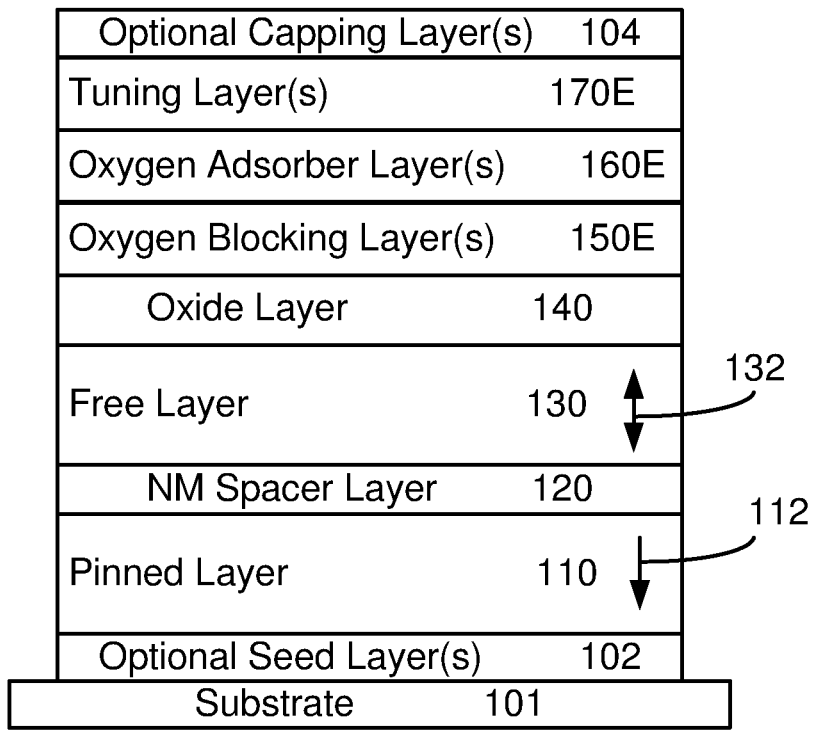
FIG. 5 depicts another exemplary embodiment of a magnetic junction usable in a magnetic memory, programmable using spin transfer torque and including at least one oxygen blocking layer.

FIG. 5 depicts another exemplary embodiment of a magnetic junction 100E in magnetic devices such as a magnetic memory programmable using spin transfer torque. For clarity, FIG. 5 is not to scale and not all components may be shown. The magnetic junction 100E is analogous to the magnetic junction(s) 100A, 100B, 100C and/or 100D. Consequently, similar components have analogous labels. The magnetic junction 100E is a bottom pinned magnetic junction that includes pinned layer 110 having magnetic moment 112, nonmagnetic spacer layer 120, free layer 130 having magnetic moment 132, oxide layer 140, oxygen blocking layer(s) 150E, oxygen adsorber layer(s) 160E and tuning layer(s) 170E that are analogous to the pinned layer 110 having magnetic moment 112, nonmagnetic spacer layer 120, free layer 130, oxide layer 140, oxygen blocking layers 150A, 150B, 150C and 150D, the oxygen adsorber layers 160B and 160C and tuning layer 170D. Although not shown, the oxygen blocking layer 155A may be present in another embodiment. In another embodiment, the order of the layers might 110, 120, 130, 140, 150E, 160E and 170E may be reversed such that the magnetic junction 100C is a top pinned magnetic junction.

The structure, function and material(s) used for the pinned layer 110, nonmagnetic spacer layer 120, free layer 130 and oxide layer 140 in the magnetic junction 100E are analogous to those used in the magnetic junction(s) 100A, 100B, 100C and/or 100D. For example, the oxide layer 140 may include at least one of magnesium oxide, tantalum oxide, tungsten oxide, titanium oxide, vanadium oxide and an oxide of a Ir/Mg bilayer. The oxide layer 140 may be at least three Angstroms thick and not more than ten Angstroms thick.

The oxygen blocking layer(s) 150E, oxygen adsorber layer(s) 160E and tuning layer(s) 170E are analogous to the oxygen blocking layer(s) 150A, 150B, 150C and/or 150D, oxygen adsorber layer(s) 160B and/or 160C and tuning layer 170D. For example, the oxygen blocking layer 150E may include at least one of Ir and Ru that may be in the thickness ranges described above. Similarly, the oxygen adsorber layer 160E may include Mg and/or Ti in the thickness ranges described above. The tuning layer(s) 170E may include at least one of Mo, Ru, W, Ir and Ta in the thickness ranges described above. Thus, the magnetic junction 100E is most analogous to the magnetic junctions 100C and 100D. Thus, both an oxygen adsorber layer 160E and a tuning layer 170E are present in addition to oxide blocking layer 150E. The oxygen blocking layer 150E is between the layers 160E and 170E and the oxide layer 140. In an alternate embodiment, the oxygen blocking layer 150E may be omitted.

The magnetic junction 100E may share the benefits of the magnetic junction(s) 100A, 100B, 100C and/or 100D. The free layer 130 and/or pinned layer 110 may have increased PMA. Further, the switching characteristics of the free layer 130 may be enhanced. Thus, the magnetic junction 100E may have improved performance.

Figure 6:
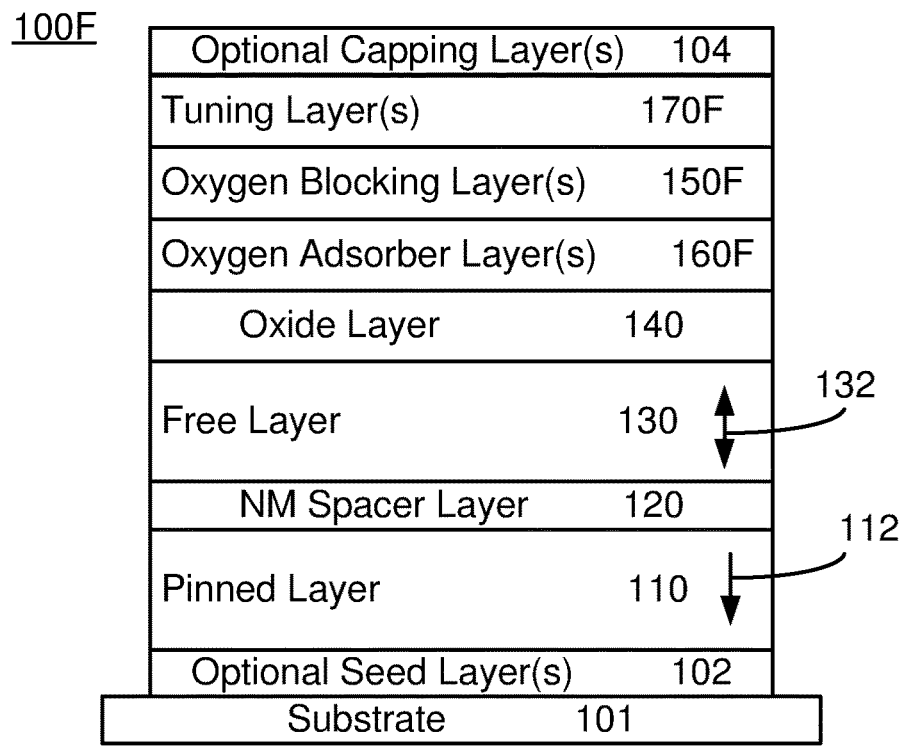
FIG. 6 depicts another exemplary embodiment of a magnetic junction usable in a magnetic memory, programmable using spin transfer torque and including at least one oxygen blocking layer.

FIG. 6 depicts another exemplary embodiment of a magnetic junction 100F in magnetic devices such as a magnetic memory programmable using spin transfer torque. For clarity, FIG. 6 is not to scale and not all components may be shown. The magnetic junction 100F is analogous to the magnetic junction(s) 100A, 100B, 100C, 100D and/or 100E. Consequently, similar components have analogous labels. The magnetic junction 100F is a bottom pinned magnetic junction that includes pinned layer 110 having magnetic moment 112, nonmagnetic spacer layer 120, free layer 130 having magnetic moment 132, oxide layer 140, oxygen blocking layer(s) 150F, oxygen adsorber layer(s) 160F and tuning layer(s) 170F that are analogous to the pinned layer 110 having magnetic moment 112, nonmagnetic spacer layer 120, free layer 130, oxide layer 140, oxygen blocking layers 150A, 150B, 150C, 150D and 150E, the oxygen adsorber layers 160B, 160C and 160E and tuning layers 170D and 170E. Although not shown, the oxygen blocking layer 155A may be present in another embodiment. In another embodiment, the order of the layers might 110, 120, 130, 140, 160F, 150F and 170F may be reversed such that the magnetic junction 100C is a top pinned magnetic junction.

The structure, function and material(s) used for the pinned layer 110, nonmagnetic spacer layer 120, free layer 130 and oxide layer 140 in the magnetic junction 100F are analogous to those used in the magnetic junction(s) 100A, 100B, 100C, 100D and/or 100E. For example, the oxide layer 140 may include at least one of magnesium oxide, tantalum oxide, tungsten oxide, titanium oxide, vanadium oxide and an oxide of a Ir/Mg bilayer. The oxide layer 140 may be at least three Angstroms thick and not more than ten Angstroms thick.

The oxygen blocking layer(s) 150F, oxygen adsorber layer(s) 160F and tuning layer(s) 170F are analogous to the oxygen blocking layer(s) 150A, 150B, 150C, 150D and/or 150E, oxygen adsorber layer(s) 160B, 160C and/or 160E and tuning layer 170D and/or 170E. For example, the oxygen blocking layer 150F may include at least one of Ir and Ru that may be in the thickness ranges described above. Similarly, the oxygen adsorber layer 160F may include Mg and/or Ti in the thickness ranges described above. The tuning layer(s) 170F may include at least one of Mo, Ru, W, Ir and Ta in the thickness ranges described above. Thus, the magnetic junction 100F is most analogous to the magnetic junctions 100B and 100D. Thus, both an oxygen adsorber layer 160F and a tuning layer 170F are present in addition to oxide layer 150F. The oxygen adsorber layer 160E is between the layers 150E and 170E and the oxide layer 140. In an alternate embodiment, the oxygen blocking layer 150E may be omitted.

The magnetic junction 100F may share the benefits of the magnetic junction(s) 100A, 100B, 100C, 100D and/or 100E. The free layer 130 and/or pinned layer 110 may have increased PMA. Further, the switching characteristics of the free layer 130 may be enhanced. Thus, the magnetic junction 100F may have improved performance.

Figure 7:
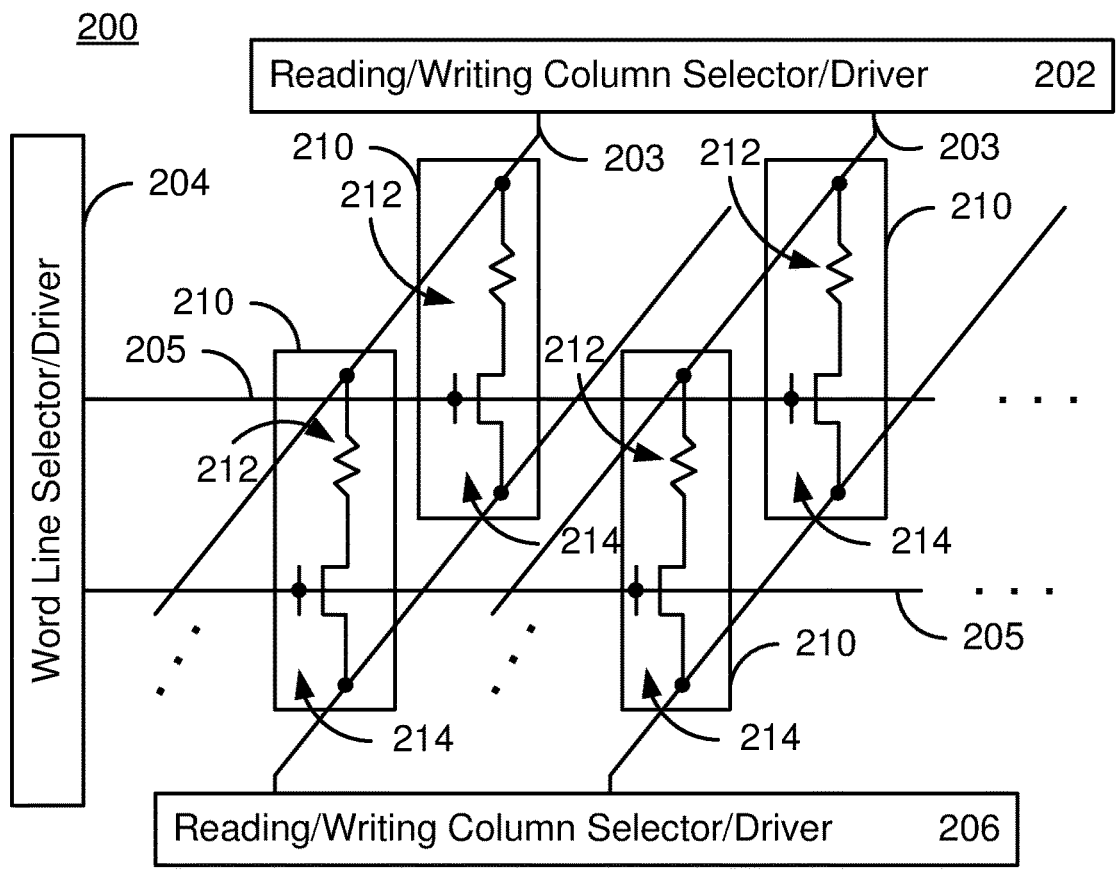
FIG. 7 depicts an exemplary embodiment of a memory utilizing magnetic junctions in the memory element(s) of the storage cell(s).

FIG. 7 depicts an exemplary embodiment of a memory 200 that may use one or more of the magnetic junctions 100A, 100A', 100B, 100C, 100D, 100E and/or 100F and/or other magnetic junctions. The magnetic memory 200 includes reading/writing column select drivers 202 and 206 as well as word line select driver 204. Note that other and/or different components may be provided. The storage region of the memory 200 includes magnetic storage cells 210. Each magnetic storage cell includes at least one magnetic junction 212 and at least one selection device 214. In some embodiments, the selection device 214 is a transistor. The magnetic junctions 212 may be one of the 100A, 100A', 100B, 100C, 100D, 100E, 100F and/or other analogous magnetic junction(s). Although one magnetic junction 212 is shown per cell 210, in other embodiments, another number of magnetic junctions 212 may be provided per cell. Because the magnetic memory 200 includes one or more of the magnetic junctions 100A, 100A', 100B, 100C, 100D, 100E, 100F and/or an analogous magnetic junction, the magnetic memory 200 may enjoy the benefits described above.

Various features have been described with respect to the magnetic junctions 100A, 100A' 100B, 100C, 100D, 100E and 100F and the magnetic memory 200. One of ordinary skill in the art will recognize that these features may be combined in manner(s) not shown and which are not inconsistent with the devices and methods described herein.

Figure 8:
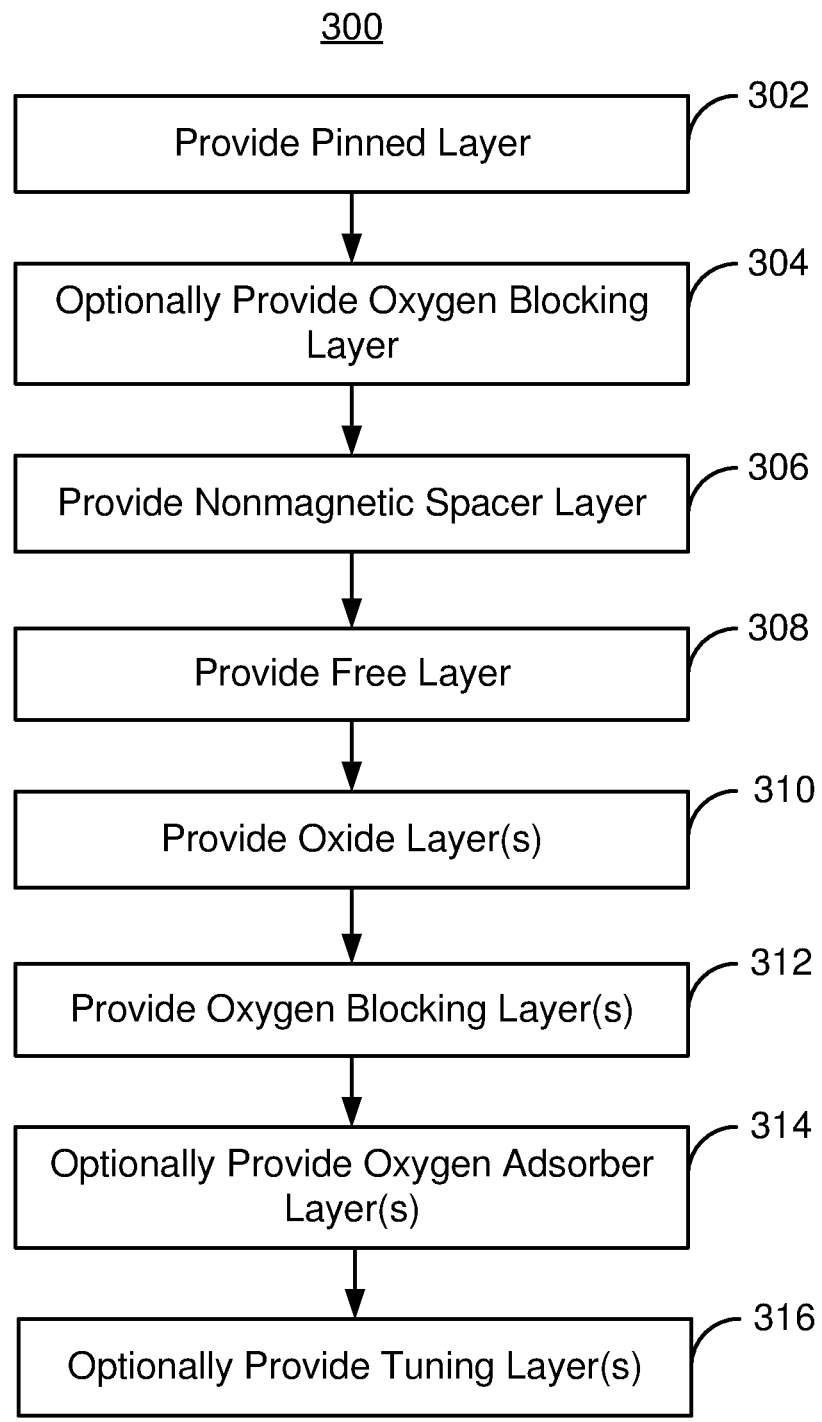
FIG. 8 is a flow chart depicting an exemplary embodiment of a method for providing a magnetic junction usable in a magnetic memory, programmable using spin transfer torque and including at least one oxygen blocking layer.

FIG. 8 depicts an exemplary embodiment of a method 300 for fabricating a magnetic junction usable in a magnetic device such as a spin transfer torque random access memory (STT-RAM) and, therefore, in a variety of electronic devices. For simplicity, some steps may be omitted, performed in another order and/or combined. Further, the method 300 may start after other steps in forming a magnetic memory have been performed. The method 300 is also described in the context of forming a single magnetic junction. However, multiple magnetic junctions may be formed substantially simultaneously. The method 300 is also described in the context of the magnetic junction 100E.

However, another magnetic junction such as the magnetic junction(s) 100A, 100A', 100B, 100C, 100D and/or 100F might be formed.

The pinned layer 110 is provided, via step 302. The pinned layer is magnetic and may have its magnetization pinned, or fixed, in a particular direction during at least a portion of the operation of the magnetic junction. The pinned layer may thus be thermally stable at operating temperatures. The pinned layer formed in step 302 may be a single layer or a multilayer. For example, the pinned layer formed in step 302 may be a SAF. In such a SAF, each magnetic layer may also include multiple layers. The pinned layer may also be another multilayer. The pinned layer formed in step 302 may have a perpendicular anisotropy energy that exceeds the out-of-plane demagnetization energy. Thus, the pinned layer may have its magnetic moment oriented perpendicular to plane. Other orientations of the magnetization of the pinned layer are possible.

Step 302 may include depositing the pinned layer on seed layer(s) 102. The seed layer(s) 102 may be selected for various purposes including but not limited to the desired crystal structure of the pinned layer, magnetic anisotropy and/or other magnetic characteristics of the pinned layer. For example, the pinned layer may be provided on a seed layer such as a (100) crystalline MgO layer that promotes a perpendicular magnetic anisotropy in the pinned layer.

In addition, one or more polarization enhancement layers (PELs) may be provided as part of or in addition to providing the pinned layer in step 302. A PEL includes high spin polarization materials. For example, a CoFeB PEL may be provided before and immediately after the pinned layer is formed in step 302. In other embodiments, one or both of these PELs may be omitted.

The oxygen blocking layer 155A may optionally be provided, via step 304. However, in other embodiments, step 304 may be omitted. A nonmagnetic spacer layer 120 is provided, via step 306. The nonmagnetic spacer layer 120 formed in step 306 may adjoin the pinned layer or may be separated from the pinned layer by other layer(s) such as a PEL. In some embodiments, a crystalline MgO tunneling barrier layer may be formed. Step 306 may include depositing MgO, which forms a tunneling barrier layer. In some embodiments, step 306 may include depositing MgO using, for example, radio frequency (RF) sputtering. Metallic Mg may be deposited, then oxidized in step 306 to provide a natural oxide of Mg. The MgO barrier layer/nonmagnetic spacer layer may also be formed in another manner. Step 306 may include annealing the portion of the magnetic junction already formed to provide crystalline MgO tunneling barrier with a (100) orientation for enhanced tunneling magnetoresistance (TMR) of the magnetic junction.

The free layer 130 is provided, via step 308. Step 308 includes depositing the material(s) for the free layer. The free layer 130 provided in step 308 may be desired to have a perpendicular magnetic anisotropy that exceeds its demagnetization energy. The magnetic moment of the free layer may thus be stable out-of-plane, including perpendicular-to-plane. In addition, a PEL may be provided as part of or in addition to the free layer 130. The free layer 130 provided in step 308 is also configured to be switched between stable magnetic states when a write current is passed through the magnetic junction. Thus, the free layer 130 is switchable utilizing spin transfer torque. The free layer 130 provided in step 308 is magnetic and thermally stable at operating temperatures.

The oxide layer 140 may be provided, via step 310. Step 310 includes depositing the metal(s) for the oxide layer 140 and exposing the metal layer to an oxide treatment. For example, step 310 may be performed by depositing an Mg layer, a Ta layer, a V layer, a Zr layer, a Mo layer and/or an Mg/Ir bilayer. An oxidation step is then performed. In some embodiments, a plasma treatment may also be performed before the oxidation treatment. For example, the Mg/Ir bilayer may undergo a plasma treatment prior to oxidation. In other embodiments, the oxide layer 140 may be formed in a different manner.

The oxygen blocking layer(s) 150E may be provided, via step 312. Step 312 includes depositing an Ir layer, a Ru, and/or a bilayer of Ru and Ir. The oxygen adsorber layer(s) 160E may optionally be provided, via step 314. Step 314 may include depositing an Mg layer. The tuning layer 170E is optionally provided, via step 316. Step 316 may include depositing one or more of a Ru layer, an Ir layer, a W layer, a Ta layer and a Mo layer. Steps 312, 314 and 316 may be performed in various orders and one or more of steps 314 and 316 may be omitted. For example, if the magnetic junction 100A is being formed, then steps 314 and 316 are omitted. If the magnetic junction 100B is being formed then step 316 may be omitted and step 314 carried out before step 312. If the magnetic junction 100E is fabricated, then all steps are performed in the order indicated in FIG. 8.

Fabrication of the magnetic junction may then be completed. For example, the capping layer(s) 104 may be deposited and the edges of the magnetic junction defined, for example by providing a mask on the layers that have been deposited and ion milling the exposed portions of the layers. Additional structures, such as contacts and conductive lines may also be formed for the device in which the magnetic junction is used.

Using the method 300, a magnetic junction having high perpendicular magnetic anisotropy pinned and/or free layers and/or improved switching characteristics may be provided. Thus, the method 300 may allow fabrication of a high perpendicular magnetic anisotropy having desired switching characteristics.

Figure 9:
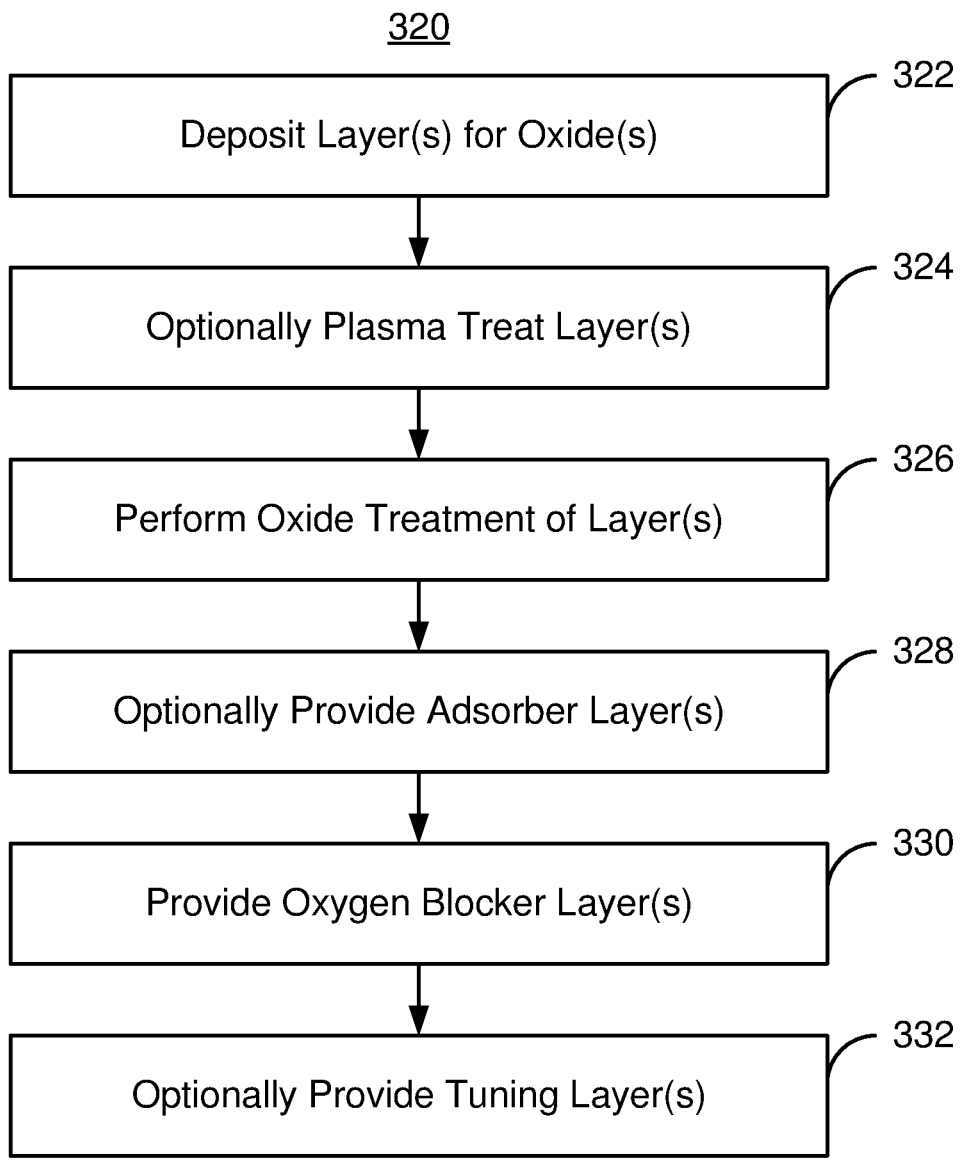
FIG. 9 is a flow chart depicting another exemplary embodiment of a method for providing a magnetic junction usable in a magnetic memory, programmable using spin transfer torque and including at least one oxygen blocking layer.

FIG. 9 is a flow chart depicting an exemplary embodiment of a method 320 for providing a portion of a magnetic junction usable in a magnetic device and including at least one interstitial glass-promoting layer and at least one adsorber. For simplicity, some steps may be omitted, performed in another order, include substeps and/or combined. Further, the method 320 start after other steps in forming a magnetic memory have been performed. Although described in terms of a single magnetic junction, multiple magnetic junctions may be fabricated. For simplicity, the method is described in the context of the magnetic junction 100F. However, the method 320 may be used for any of the magnetic junctions 100A, 100B, 100C, 100D, 100E and/or 100F.

The metal layer(s) for the oxide layer 140 are deposited, via step 322. For example, step 322 may be performed by depositing an Mg layer, a Ta layer, a V layer, a Zr layer, a Mo layer and/or an Mg/Ir bilayer. A plasma treatment may optionally be performed, via step 324. For example, the Mg/Ir bilayer may undergo a plasma treatment. An oxidation step is then performed, via step 326. The plasma treatment of step 324 may be performed prior to the oxidation step 326. Thus, the layer(s) deposited in step 322 are exposed to an oxygen atmosphere and, optionally, heating the magnetic junction.

The oxygen adsorber layer(s) 160F may optionally be provided, via step 328. Step 328 may include depositing an Mg layer. The oxygen blocking layer(s) 150F may be provided, via step 330. Step 330 may include depositing an Ir layer, a Ru, and/or a bilayer of Ru and Ir. The tuning layer 170F is optionally provided, via step 330. Step 330 may include depositing one or more of a Ru layer, an Ir layer, a W layer, a Ta layer and a Mo layer. For other magnetic junctions 100A, 100A', 100B, 100C, 100D and 100E, Steps 328, 330 and 332 may be performed in various orders and one or more of steps 328 and 332 may be omitted.

Fabrication of the magnetic junction may then be completed. For example, the capping layer(s) 104 may be deposited and the edges of the magnetic junction defined, for example by providing a mask on the layers that have been deposited and ion milling the exposed portions of the layers. Additional structures, such as contacts and conductive lines may also be formed for the device in which the magnetic junction is used.

Using the method 320, a magnetic junction having high perpendicular magnetic anisotropy pinned and/or free layers and/or improved switching characteristics may be provided. Thus, the method 320 may allow fabrication of a high perpendicular magnetic anisotropy having desired switching characteristics.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction residing on a substrate and usable in a magnetic device, the magnetic junction comprising:
   a pinned layer;
   a nonmagnetic spacer layer;
   a free layer, the free layer being switchable between a plurality of stable magnetic states when a write current is passed through the magnetic junction, the nonmagnetic spacer layer residing between the pinned layer and the free layer;
   an oxide layer adjacent to the free layer, the free layer being between the nonmagnetic spacer layer and the oxide layer;
   at least one oxygen blocking layer adjacent to the oxide layer, the at least one oxygen blocking layer including Ir, the oxide layer being between the at least one oxygen blocking layer and the free layer; and
   at least one oxygen adsorber layer sharing a first interface with the at least one oxygen blocking layer, the at least one oxygen adsorber layer having a location between the at least one oxygen blocking layer and the oxide layer, the oxygen adsorber layer having a first oxygen affinity greater than or equal to a second oxygen affinity for the oxygen blocking layer.

2. The magnetic junction of claim 1 wherein the at least one oxygen blocking layer is not more than twenty Angstroms from the free layer and the oxide layer shares an interface with the free layer.

3. The magnetic junction of claim 1 further comprising:
   at least one tuning layer, the at least one oxygen blocking layer being between the at least one tuning layer and the free layer.

4. The magnetic junction of claim 1 wherein the at least one oxygen adsorber layer includes at least one of Mg and Ti.

5. The magnetic junction of claim 1 further comprising:
   at least one tuning layer, the at least one oxygen blocking layer being between the at least one tuning layer and the oxide layer.

6. The magnetic junction of claim 5 wherein the at least one tuning layer includes at least one of Mo, W, Ir, Ru and Ta.

7. The magnetic junction of claim 1 wherein the at least one oxygen blocking layer is selected from an Ir layer, an Ir/Ru bilayer and a Ru/Ir bilayer.

8. The magnetic junction of claim 1 wherein the oxide layer includes at least one of magnesium oxide, tantalum oxide, tungsten oxide, titanium oxide, vanadium oxide and a bilayer oxide layer, the bilayer including Ir and Mg.

9. A magnetic memory residing on a substrate and comprising:
   a plurality of magnetic storage cells, each of the plurality of magnetic storage cells including a pinned layer, a nonmagnetic spacer layer, a free layer, an oxide layer, at least one oxygen blocking layer and at least one oxygen adsorber layer, the free layer being switchable between a plurality of stable magnetic states when a write current is passed through the magnetic junction, the nonmagnetic spacer layer residing between the pinned layer and the free layer, the oxide layer being adjacent to the free layer, the free layer being between the nonmagnetic spacer layer and the oxide layer, the at least one oxygen blocking layer being adjacent to the oxide layer, the at least one oxygen blocking layer including Ir, the oxide layer being between the at least one oxygen blocking layer and the free layer, the at least one oxygen adsorber layer sharing a first interface with the at least one oxygen blocking layer, the at least one oxygen adsorber layer having a location between the at least one oxygen blocking layer and the oxide layer, the oxygen adsorber layer having a first oxygen affinity greater than or equal to a second oxygen affinity for the oxygen blocking layer; and
   a plurality of bit lines coupled with the plurality of magnetic storage cells.

10. A method for providing a magnetic junction usable in a magnetic device, the method comprising:
   providing a pinned layer;
   providing a nonmagnetic spacer layer;
   providing a free layer, the free layer being switchable between a plurality of stable magnetic states when a write current is passed through the magnetic junction, the nonmagnetic spacer layer residing between the pinned layer and the free layer;
   providing an oxide layer adjacent to the free layer, the free layer being between the nonmagnetic spacer layer and the oxide layer;
   providing at least one oxygen blocking layer adjacent to the oxide layer, the at least one oxygen blocking layer including Ir, the oxide layer being between the at least one oxygen blocking layer and the free layer; and
   providing at least one oxygen adsorber layer sharing a first interface with the at least one oxygen blocking layer, the at least one oxygen adsorber layer having a location between the at least one oxygen blocking layer and the oxide layer, the oxygen adsorber layer having a first oxygen affinity greater than or equal to a second oxygen affinity for the oxygen blocking layer.

11. The method of claim 10 wherein the step of providing the oxide layer further includes:
    depositing at least one layer, the at least one layer including at least one of Mg, Ta, W, Ti, V, Zr, Mg and Ir; and
    performing an oxide treatment for the at least one layer.

12. The method of claim 11 wherein the step of removing the adsorber layer further includes:
    performing a plasma treatment before the oxide treatment.

13. The method junction of claim 10 further comprising:
    providing at least one tuning layer, the oxygen blocking layer being between the at least one tuning layer and the free layer.

14. The method of claim 10 further comprising:
    providing at least one tuning layer, the oxygen blocking layer being between the at least one tuning layer and the oxide layer.

15. The method of claim 10 wherein the at least one oxygen blocking layer is selected from an Ir layer, an Ir/Ru bilayer and a Ru/Ir bilayer.

* * * * *